(12) United States Patent
Ikemoto et al.

(10) Patent No.: US 10,477,084 B2
(45) Date of Patent: Nov. 12, 2019

(54) MANUFACTURING METHOD FOR CAMERA MODULE

(71) Applicant: Murata Manufacturing Co., Ltd., Nagaokakyo-shi, Kyoto-fu (JP)

(72) Inventors: Nobuo Ikemoto, Nagaokakyo (JP); Atsushi Kumano, Nagaokakyo (JP); Jerry Hsieh, Nagaokakyo (JP); Jun Sasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 895 days.

(21) Appl. No.: 14/826,438

(22) Filed: Aug. 14, 2015

(65) Prior Publication Data
US 2015/0358517 A1  Dec. 10, 2015

Related U.S. Application Data

(63) Continuation of application No. PCT/JP2014/057448, filed on Mar. 19, 2014.

(30) Foreign Application Priority Data

Apr. 26, 2013 (JP) .................. 2013-093487

(51) Int. Cl.
*H04N 5/225* (2006.01)
*H01L 27/146* (2006.01)
(Continued)

(52) U.S. Cl.
CPC ..... *H04N 5/2253* (2013.01); *H01L 27/14618* (2013.01); *H01L 27/14683* (2013.01);
(Continued)

(58) Field of Classification Search
CPC . H05K 2201/10121; H05K 1/182–188; H05K 3/0032; H05K 2201/0195; H04N 5/2253; H04N 5/2254
See application file for complete search history.

(56) References Cited

U.S. PATENT DOCUMENTS

| 6,384,473 B1 * | 5/2002 | Peterson .............. B81B 7/0067 257/680 |
| 2006/0202318 A1 | 9/2006 | Satou et al. |

(Continued)

FOREIGN PATENT DOCUMENTS

| JP | 2006-253936 A | 9/2006 |
| JP | 2008-263551 A | 10/2008 |

(Continued)

OTHER PUBLICATIONS

Official Communication issued in International Patent Application No. PCT/JP2014/057448, dated Jun. 17, 2014.

*Primary Examiner* — Livius R. Cazan
(74) *Attorney, Agent, or Firm* — Keating & Bennett, LLP

(57) ABSTRACT

A manufacturing method for a camera module including a multilayer body in which an image sensor IC and a lens are arranged with an optical path provided in the multilayer body being disposed therebetween includes a first step and a second step. In the first step, the multilayer body is formed by stacking and combining flexible sheets. In the second step, a through hole is formed in flexible base material layers that constitute a portion of the multilayer body to form the optical path defined by the through hole.

18 Claims, 10 Drawing Sheets

(51) Int. Cl.
*H05K 3/00* (2006.01)
*H05K 5/00* (2006.01)

(52) U.S. Cl.
CPC ......... *H04N 5/2254* (2013.01); *H05K 3/0094* (2013.01); *H05K 5/0091* (2013.01); *Y10T 29/49131* (2015.01); *Y10T 29/49156* (2015.01); *Y10T 29/49167* (2015.01)

(56) References Cited

U.S. PATENT DOCUMENTS

| | | | |
|---|---|---|---|
| 2008/0044637 A1* | 2/2008 | Masuda | H05K 3/0032 428/220 |
| 2009/0092353 A1* | 4/2009 | Chan | G02B 6/1221 385/14 |
| 2009/0206349 A1* | 8/2009 | Yamada | B81C 1/00269 257/81 |
| 2010/0103296 A1 | 4/2010 | Nakagiri et al. | |
| 2013/0026591 A1 | 1/2013 | Iwafuchi | |

FOREIGN PATENT DOCUMENTS

| | | |
|---|---|---|
| JP | 2009-201000 A | 9/2009 |
| JP | 4849703 B2 | 1/2012 |
| JP | 2013-30526 A | 2/2013 |
| WO | 2011/043382 A1 | 4/2011 |

\* cited by examiner

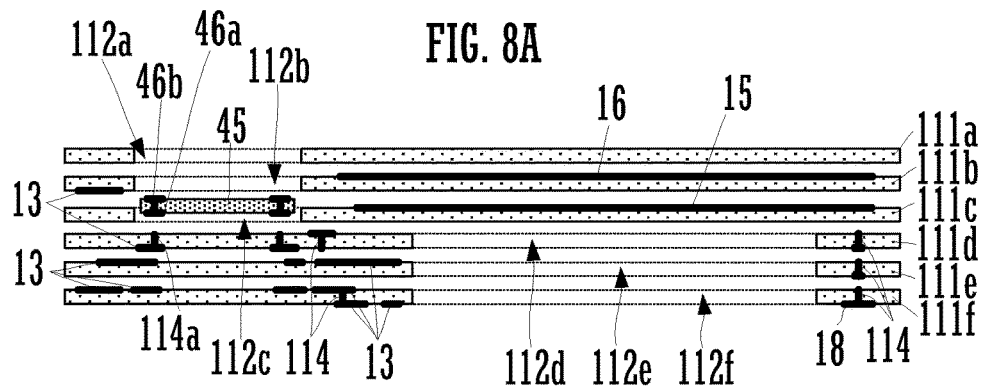
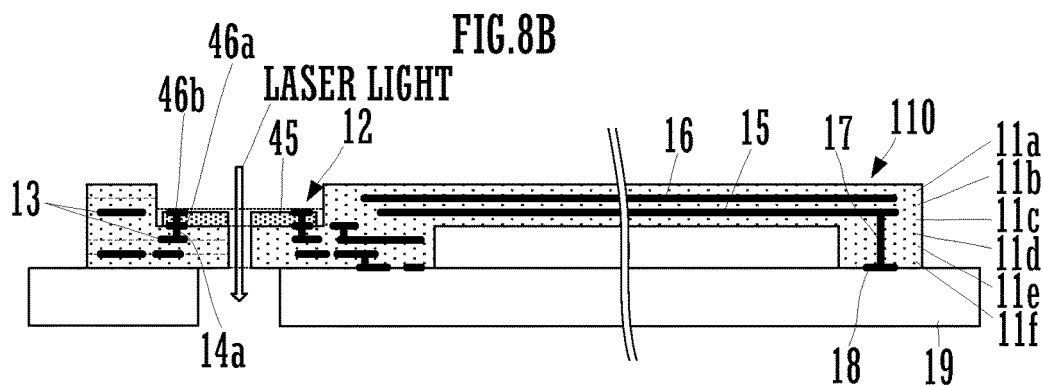
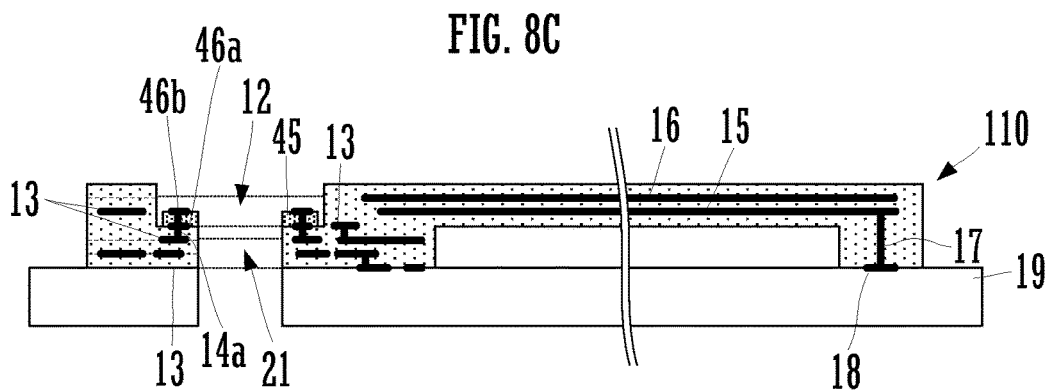
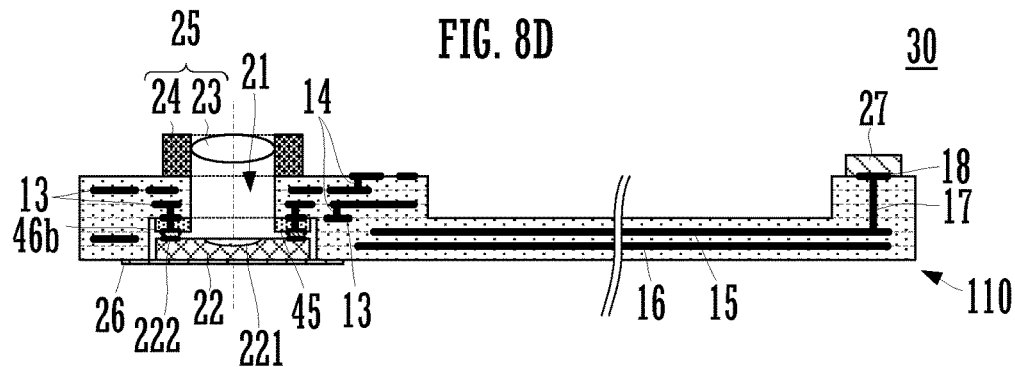

MANUFACTURING METHOD FOR CAMERA MODULE

BACKGROUND OF THE INVENTION

1. Field of the Invention

The present invention relates to a manufacturing method for a camera module including a multilayer body.

2. Description of the Related Art

At present, most portable devices, such as mobile phones and PDAs, have a photographing function. For example, a camera module that achieves such a photographing function is described in Japanese Patent No. 4849703. FIG. 10A is a sectional side view of a camera module 40 of the related art configured with reference to Japanese Patent No. 4849703.

The camera module 40 includes a substrate (flexible wiring board) 44, a substrate (metal plate) 45, an image sensor IC 22, and a lens unit 25. The lens unit 25 includes a lens 23 and a lens driver 24. The image sensor IC 22 includes a light receiving element 221.

The substrate 44 and the substrate 45 are stacked. A through hole 21 is provided in the substrates 44 and 45. Although a forming method and a forming time of the through hole 21 are not clear from Japanese Patent No. 4849703, usually, the through hole 21 is obtained by forming a through hole in each of the substrates 44 and 45 and then bonding (stacking) the substrates 44 and 45. The lens unit 25 and the image sensor IC are arranged with the through hole 21 being disposed therebetween. Light passing through the lens 23 travels through an optical path defined by the through hole 21, and is captured by the light receiving element 221.

When the camera module 40 is actually manufactured, as illustrated in FIGS. 10B and 10C, the through hole formed in the substrate 44 and the through hole formed in the substrate 45 are sometimes misaligned with each other, for example, owing to stacking accuracy.

FIG. 10B is a sectional side view of the camera module 40 when the positions of the through holes are misaligned. FIG. 10C is a plan view of the substrates 44 and 45 when the positions of the through holes are misaligned.

In this case, since a wall surface of the through hole 21 is stepped, light passing through the lens 23 is reflected by the wall surface of the through hole 21. For this reason, the light receiving element 221 may not properly capture the light. Further, since the aperture area of the through hole 21 is decreased, the amount of light captured by the light receiving element 221 is reduced. As a result, the optical characteristics of the camera module 40 are significantly deteriorated.

In addition, when the through holes are formed in the substrates 44 and 45, the strength of the substrates 44 and 45 is decreased. Hence, it may be difficult to retain the shapes of the substrates 44 and 45. If the substrates 44 and 45 in such a state are used, the wall surface of the through hole 21 is likely to be stepped.

SUMMARY OF THE INVENTION

Accordingly, preferred embodiments of the present invention provide a manufacturing method for a camera module having excellent optical characteristics.

A manufacturing method according to a first aspect of various preferred embodiments of the present invention is for a camera module which includes a multilayer body formed by combining a plurality of first members and in which an image sensor IC and a lens are arranged with an optical path provided in the multilayer body being disposed therebetween. The manufacturing method of the first aspect includes a first step and a second step. In the first step, the multilayer body is formed by stacking and combining a plurality of first members. In the second step, a through hole is formed in the plurality of first members that constitute at least a portion of the multilayer body to provide the optical path defined by the through hole. The multilayer body includes a cavity opening inward from a first surface in a stacking direction. The through hole extends from a bottom surface of the cavity to a second surface of the multilayer body in the stacking direction. In the second step, the second surface of the multilayer body is set in contact with a flat working surface, and the through hole is formed from a side of the first surface of the multilayer body.

In these steps, the position of the through hole is not displaced among the plural flexible sheets. For this reason, a wall surface of the through hole is not stepped or the aperture area of the through hole is not reduced. As a result, it is possible to manufacture a camera module having excellent optical characteristics.

Since the multilayer body has a predetermined thickness, the strength of the multilayer body is ensured even after the through hole is formed in the multilayer body. For this reason, the multilayer body does not deform when being treated in a later step.

Further, in these steps, irradiation of a light receiving surface of the image sensor IC with external light other than light passing through the lens is greatly reduced by storing the image sensor IC within the cavity.

Further, since the multilayer body is machined on the flat working surface in these steps, the multilayer body is easily moved before and after machining. Moreover, since burrs (protrusions) are not formed at the rim of the through hole on the bottom surface side of the cavity, the image sensor IC can be easily mounted on the bottom surface of the cavity.

Preferably, the manufacturing method according to the first aspect further includes a third step of mounting the image sensor IC and the lens with the through hole being disposed therebetween.

In the manufacturing method according to the first aspect, preferably, the through hole is formed by laser machining in the second step.

In this step, the through hole is formed with high accuracy. Further, the wall surface of the through hole is made smooth. In addition, a die used for, for example, blanking is unnecessary.

A manufacturing method according to a second aspect of various preferred embodiments of the present invention is for a camera module which includes a multilayer body formed by combining a first member and a second member and in which an image sensor IC and a lens are arranged with an optical path provided in the multilayer body being disposed therebetween. The manufacturing method of the second aspect includes a first step and a second step. In the first step, the multilayer body is formed by stacking and combining the first and second members. In the second step, a through hole is formed in the stacked and combined first and second members to form the optical path defined by the through hole. The multilayer body includes a cavity opening inward from a first surface in a stacking direction. The second member is disposed on a bottom surface of the cavity.

Through these steps, a camera module having excellent optical characteristics is manufactured. Further, when the multilayer body is treated in a step after the through hole is formed in the multilayer body, it does not deform. Moreover, the second member increases the strength of the camera module.

Preferably, the first member includes a plurality of first members, the manufacturing method of the second aspect further includes a third step of stacking and combining the plurality of first members, and the first step is performed after the third step.

Preferably, the first member includes a plurality of first members, the manufacturing method of the second aspect further includes a third step of stacking and combining the plurality of first members, and the first step and the third step are performed simultaneously.

This step reduces the number of steps of the method.

In the manufacturing method of the second aspect, preferably, a second surface of the multilayer body in the stacking direction is set in contact with a flat working surface, and the through hole is formed from a side of the first surface of the multilayer body.

Preferably, the manufacturing method of the second aspect further includes a fourth step of mounting the image sensor IC and the lens with the through hole being disposed therebetween.

In the manufacturing method of the second aspect, preferably, the second member is a member shaped like a flat plate and having an elastic modulus higher than an elastic modulus of the first member.

In this step, the strength of the camera module is increased further.

In the manufacturing method of the second aspect, preferably, the through hole is formed by laser machining in the second step.

In the manufacturing method of the second aspect, preferably, in the first step, heat-pressing is performed while an interlayer connection conductor provided in the first member and a conductor layer provided in the second member are in contact with each other.

In this step, the interlayer connection conductor and the conductor layer are joined by heat-pressing. The second member is thus fixed to the first member. For this reason, a joining material for fixing the second member to the first member is unnecessary.

In the manufacturing method of the first or second aspect, preferably, the first member is formed of thermoplastic resin.

According to various preferred embodiments of the present invention, it is possible to manufacture a camera module having excellent optical characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A to 8D are sectional side views illustrating a manufacturing method for a camera module according to a third preferred embodiment of the present invention.

DETAILED DESCRIPTION OF THE PREFERRED EMBODIMENTS

First Preferred Embodiment

A manufacturing method for a camera module 10 according to a first preferred embodiment of the present invention will be described. FIGS. 1A to 1D are sectional side views illustrating the manufacturing method for the camera module 10.

Figure 1A:
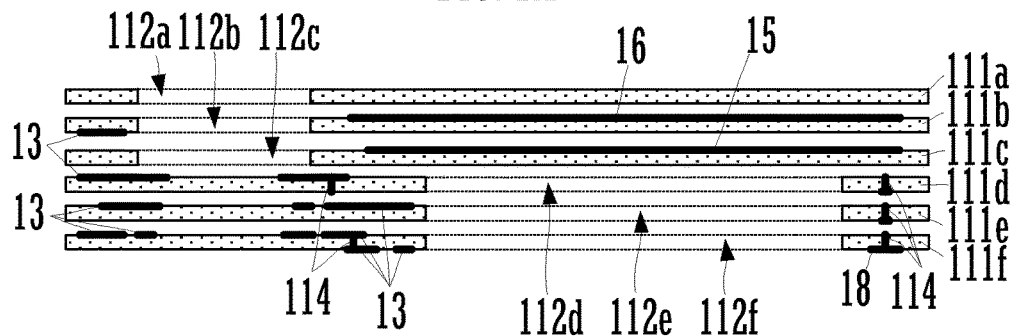
FIGS. 1A to 1D are sectional side views illustrating a manufacturing method for a camera module according to a first preferred embodiment of the present invention.

As illustrated in FIG. 1A, a plurality of flexible sheets 111a to 111f are prepared. As the material of the flexible sheets 111a to 111f, thermoplastic resin is preferably used, and, for example, a liquid crystal polymer is preferably used. The liquid crystal polymer has a hygroscopicity lower than those of other materials represented by polyimide. That is, the liquid crystal polymer does not easily absorb moisture. For this reason, the dimensional change in the flexible sheets 111a to 111f is significantly reduced or prevented by using the liquid crystal polymer as the material of the flexible sheets 111a to 111f. The flexible sheets 111a to 111f correspond to the first member in the present invention. The following steps are performed for a multi-sheet in which a plurality of same structures are arranged.

The flexible sheets 111a to 111f each include metal films, such as copper foil, on one surface or both surfaces thereof. The metal films provided on the flexible sheets 111a to 111f are patterned preferably by utilizing photolithography and etching, for example. Thus, conductive patterns 13, a signal conductor 15, a ground conductor 16, and a connector mounting land 18 are formed at proper positions of the flexible sheets 111a to 111f. Further, holes for via conductors are formed in the flexible sheets 111a to 111f, for example, by laser machining, and the holes are filled with conductive paste 114. The conductive paste 114 is preferably formed of a conductive material mainly composed of tin or silver, for example. Moreover, through holes 112a to 112f are formed in the flexible sheets 111a to 111f by die cutting.

Next, the flexible sheets 111a to 111f are stacked. At this time, when peripheral circuit components are to be incorporated in the camera module 10, through holes for accommodating the components are formed together with the through holes 112a to 112f by a method similar to the method for forming the through holes 112a to 112f (herein die cutting), and the peripheral circuit components are disposed in the through holes. The through holes 112a to 112f and the through holes in which the peripheral circuit components are to be disposed may be formed by, for example, punching.

Next, the stacked flexible sheets 111a to 111f are subjected to thermocompression bonding (heat-pressing). As described above, the flexible sheets 111a to 111f are formed of thermoplastic resin. For this reason, the flexible sheets 111a to 111f can be joined by thermocompression bonding without using bonding layers such as bonding sheets or prepreg, and can be combined into a multilayer body 110. At the time of thermocompression bonding, the conductive paste 114 filled in the holes for the via conductors is metalized (sintered) to form via conductors 14 and a connection via conductor 17. A portion where the through holes 112a to 112c are formed serves as a cavity 12.

The multilayer body 110 includes the conductor patterns 13, the via conductors 14, flexible base material layers 11a to 11f, etc. Hereinafter, a principal surface where the cavity 12 is provided, of principal surfaces of the multilayer body 110 (surfaces perpendicular to the stacking direction), is referred to as a first principal surface, and a surface opposite from the first principal surface is referred to as a second principal surface. The first principal surface corresponds to a "first surface in a stacking direction", and the second principal surface corresponds to a "second surface in the stacking direction" in the present invention.

Figure 1B:
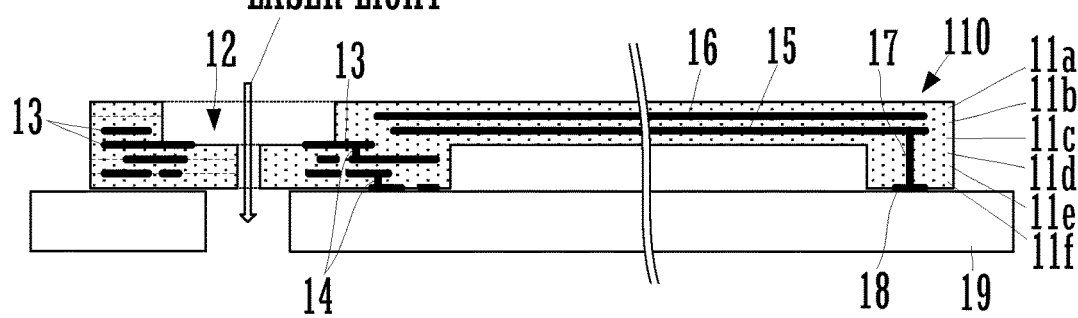
Figure 1C:
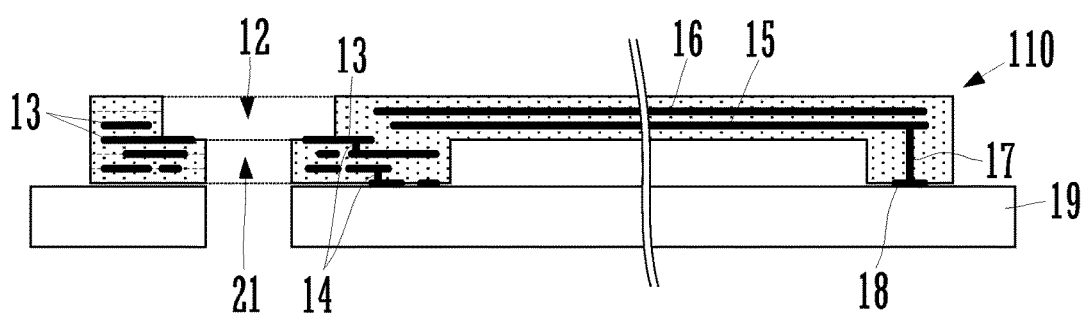

Next, as illustrated in FIG. 1B, the second principal surface of the multilayer body 110 is set in contact with a flat or substantially flat working surface of a worktable 19. Then, as illustrated in FIGS. 1B and 1C, a bottom surface of the cavity 12 is irradiated with laser light from a side of the first principal surface to form a through hole 21 extending from the bottom surface of the cavity 12 to the second principal surface. At this time, a through hole 21 having a predetermined aperture area is formed by moving the position to be irradiated with laser light so that the center of the through hole 21 nearly coincides with the center of the cavity 12 in plan view. In such laser machining, for example, an ultraviolet (UV) laser is used.

Figure 2A:
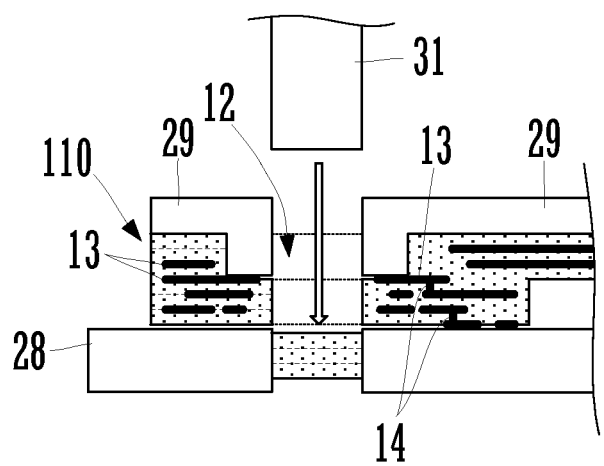
FIG. 2A is a sectional side view illustrating a step for forming a through hole by blanking.
Figure 2B:
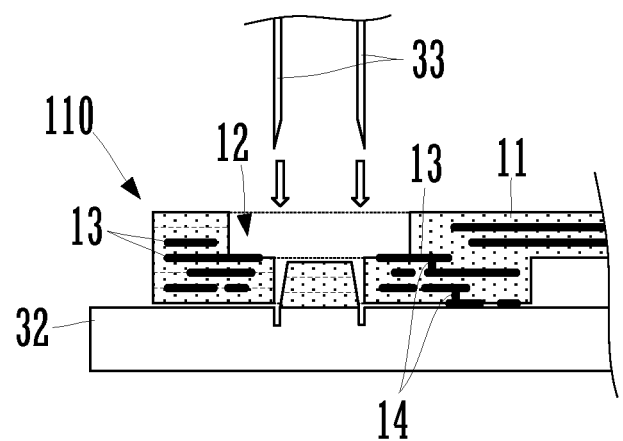
FIG. 2B is a sectional side view illustrating a step of forming a through hole by shearing and force cutting.

The through hole 21 may be formed by methods illustrated in FIGS. 2A and 2B. FIG. 2A is a sectional side view illustrating a method for forming a through hole 21 by blanking. First, the multilayer body 110 is clamped and fixed by dies 28 and 29. Next, the multilayer body 110 is blanked to form a through hole 21 by pressing a punch 31 against the bottom surface of the cavity 12.

FIG. 2B is a sectional side view illustrating a method for forming a through hole 21 by shearing and force cutting. First, the second principal surface of the multilayer body 110 is set in contact with a flat or substantially flat working surface of a worktable 32. Next, the multilayer body 110 is force-cut to form a through hole 21 by pressing a blade 33 against the bottom surface of the cavity 12 from the side of the first principal surface.

Laser machining can form the through hole 21 with higher accuracy than blanking and shearing and force cutting. Further, laser machining can form a smoother wall surface of the through hole 21 than blanking and shearing and force cutting. Therefore, the optical characteristics of the camera module 10 are stabilized. Further, laser machining does not need dies that are used in blanking. If shavings remain in the optical path of the camera module, they affect image quality. By adopting laser machining, shavings produced during machining are unlikely to remain in the through hole 21 serving as the optical path. In contrast, blanking and shearing and force cutting form the through hole 21 in a time shorter than laser machining.

Figure 1D:
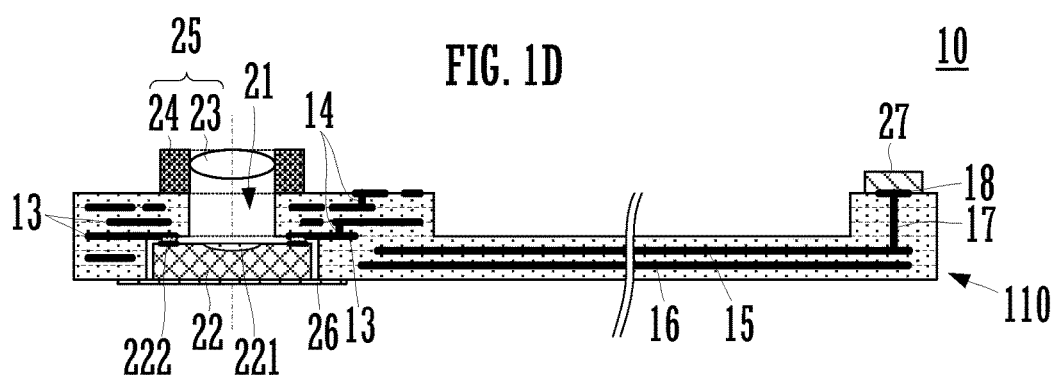

Next, as illustrated in FIG. 1D, an image sensor IC 22 including a light receiving element 221 and an external connection land 222 is mounted in the cavity 12. At this time, the image sensor IC 22 is disposed so that the light receiving element 221 faces the bottom surface of the cavity 12. Further, the external connection land 222 is connected to the conductor pattern 13 provided on the bottom surface of the cavity 12.

A cover member 26 is disposed to cover an open surface of the cavity 12, and is fixed to the multilayer body 110. To fix the cover member 26 to the multilayer body 110, a bonding agent may be used or an adhesive may be used, for example. The cover member 26 preferably includes a flat plate made of a light-shielding material.

Further, a lens unit 25 including a lens 23 and a lens driver 24 is mounted on the first principal surface of the multilayer body 110. At this time, the lens unit 25 is disposed so that the aperture center of the through hole 21 coincides with the center of the lens 23. The lens driver 24 serves to hold the lens 23 and to adjust the length of the optical path.

In this way, the lens 23 and the image sensor IC 22 are arranged with the through hole 21 being disposed therebetween. The through hole 21 defines and functions as the optical path that optically couples the lens 23 and the image sensor IC 22.

Further, a connector element 27 is mounted to be connected to a connector mounting land 18.

Finally, a camera module 10 illustrated in FIG. 1D is completed by cutting a multi-sheet in which a plurality of structures of the camera module 10 are arranged.

When the flexible sheets 111d to 111f are subjected to thermocompression bonding after the through holes are formed therein, the positions of the through holes formed in the flexible sheets 111d to 111f are sometimes misaligned. When thermoplastic resin is used, a multilayer body can be formed by a simple method, but great deformation occurs during thermocompression bonding. In this case, in the formed through hole 21, the wall surface is stepped or the aperture area is reduced. In the first preferred embodiment, the multilayer body 110 is formed preferably by stacking and combining the flexible sheets 111a to 111f. After that, the through hole 21 serving as the optical path is formed in the multilayer body 110. That is, there is no need to perform thermocompression bonding after the through holes are formed. For this reason, the wall surface of the through hole 21 is not stepped, or the aperture area of the through hole 21 is not reduced. As a result, it is possible to manufacture a camera module having excellent optical characteristics.

A portion of the multilayer body 110 to be an imaging function portion 35 (see FIG. 5) has a predetermined thickness. For this reason, the strength of the portion serving as the imaging function portion 35 is ensured even after the through hole 21 is formed in the multilayer body 110. As a result, when the multilayer body 110 is treated in a later step, the risk of deformation of the portion serving as the imaging function portion 35 is reduced.

When laser machining is performed while the first principal surface (principal surface in which the cavity 12 is provided) of the multilayer body 110 is set in contact with the working surface, the flexible base material layers 11*d* to 11*f* deform during formation of the through hole 21. For this reason, the flexible base material layers 11*d* to 11*f* need to be supported by a die suited for the cavity 12. As a result, a lot of trouble is taken to move the multilayer body 110 before and after laser machining.

In the first preferred embodiment, laser machining preferably is performed while the second principal surface (principal surface opposite from the first principal surface) of the multilayer body 110 is set in contact with the flat working surface of the worktable 19. In this case, the above-described die is unnecessary. For this reason, the multilayer body 110 is easily moved before and after laser machining.

If the through hole 21 is formed by applying laser light from the side of the second principal surface of the multilayer body 110, burrs (protrusions) are formed at the rim of the through hole 21 on the bottom surface side of the cavity 12. That is, burrs are formed on the side where the image sensor IC 22 is to be mounted. In this case, the image sensor IC 22 may be mounted while being inclined with respect to the bottom surface of the cavity 12. According to the first preferred embodiment, since the through hole 21 is formed by applying laser light from the side of the first principal surface, such burrs are not formed. For this reason, the image sensor IC 20 is able to be accurately mounted without being inclined.

Figure 3:
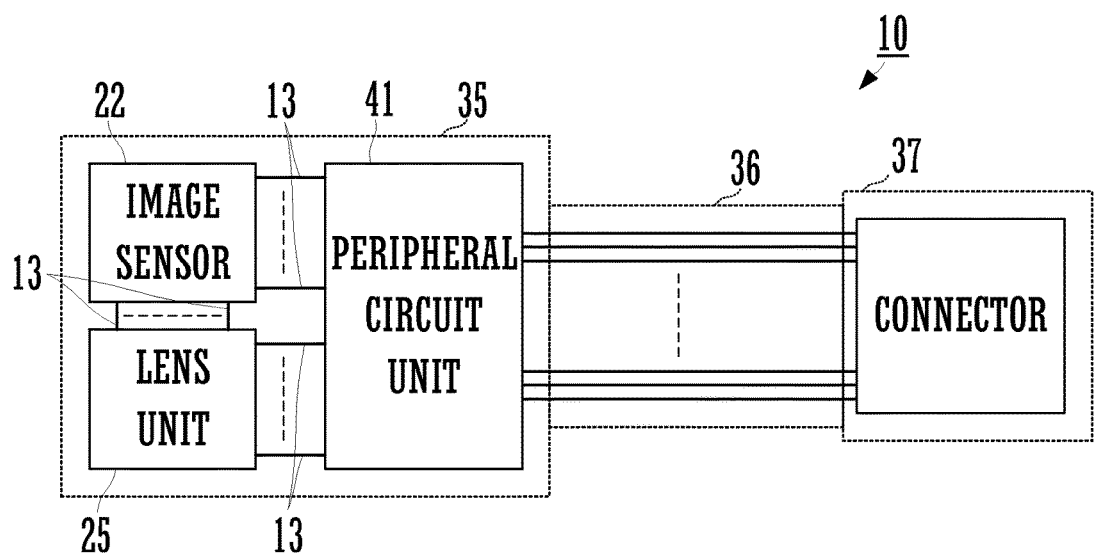
FIG. 3 is a functional block diagram of the camera module according to the first preferred embodiment of the present invention.

Next, the camera module 10 manufactured by the above-described method will be described. FIG. 3 is a functional block diagram of the camera module 10. The camera module 10 preferably includes an imaging function portion 35, a connecting portion 36, and a connector forming portion 37. The imaging function portion 35 is connected to the connector forming portion 37 via the connecting portion 36.

The imaging function portion 35 includes the image sensor IC 22, the lens unit 25, and a peripheral circuit unit 41. The peripheral circuit unit 41 includes a capacitor, an inductor, a resistor, a filter, etc. The image sensor IC 22, the lens unit 25, and the peripheral circuit unit 41 are connected by conductor patterns 13. The connecting portion 36 includes lines such as a signal line, a power supply line, and a ground line.

As illustrated in FIGS. 1A to 1D and 3, the peripheral circuit unit 41 includes the conductor patterns 13, the via conductors 14, and the flexible base material layers 11*a* to 11*f*, and includes peripheral circuit components (not illustrated) as necessary. The connecting portion 36 includes the signal conductor 15, the ground conductor 16, and the flexible base material layers 11*a* to 11*c*. The connector forming portion 37 includes the connection via conductor 17, the connector mounting land 18, the connector element 27, and the flexible base material layers 11*a* to 11*f*.

Figure 4A:
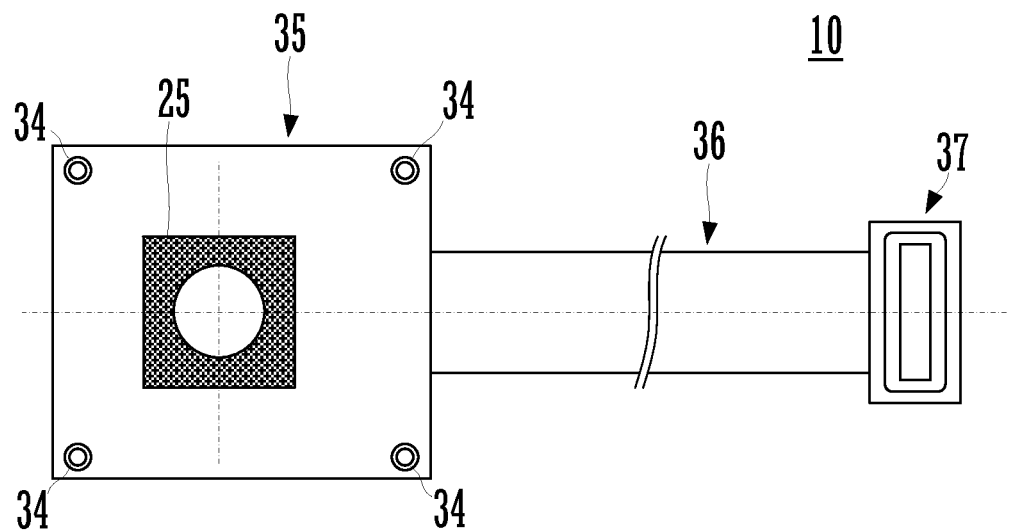
FIG. 4A is a plan view of one principal surface of the camera module of the first preferred embodiment of the present invention.
Figure 4B:
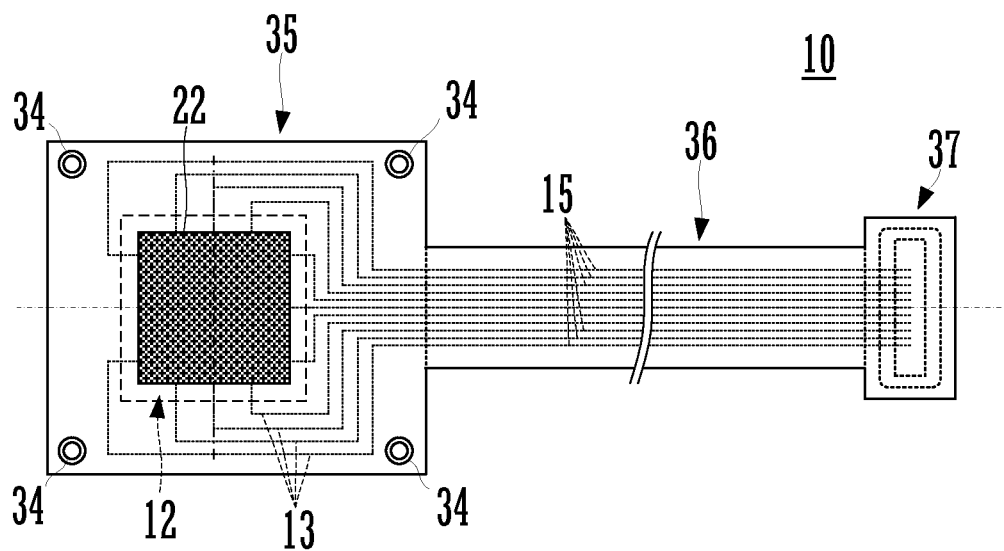
FIG. 4B is a plan view of the other principal surface of the camera module of the first preferred embodiment of the present invention.
Figure 5:
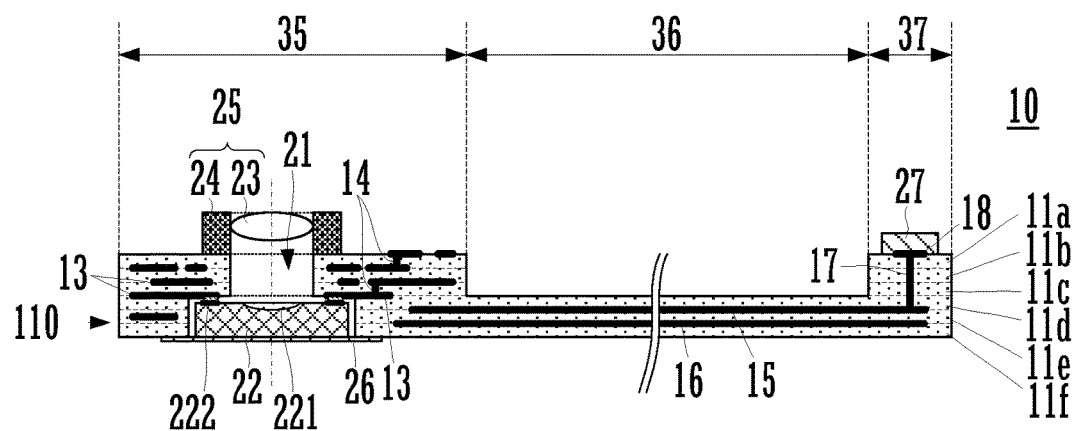
FIG. 5 is a sectional side view of the camera module of the first preferred embodiment of the present invention.

FIG. 4A is a plan view of one principal surface of the camera module 10. FIG. 4B is a plan view of the other principal surface of the camera module 10. In FIG. 4B, illustration of the cover member 26 is omitted. FIG. 5 is a sectional side view of the camera module 10 and is the same as FIG. 1D.

The imaging function portion 35 is shaped like a rectangular or substantially rectangular flat plate. In plan view, the lens unit 25 and the image sensor IC 22 are disposed in the center of the imaging function portion 35, and holes 34 for fixing to, for example, an external substrate are provided in four corners of the imaging function portion 35. The lens unit 25 is disposed on the one principal surface. The image sensor IC 22 is disposed within the cavity 12 provided in the other principal surface.

The connecting portion 36 is shaped like a band whose longitudinal direction is a direction to connect the imaging function portion 35 and the connector forming portion 37. As described above, the lines, such as the signal conductors 15, are provided in the connecting portion 36. The lines are each connected at a first end to the conductor patterns 13 in the imaging function portion 35, and connected at a second end to the connection via conductor 17 (see FIG. 1) in the connector forming portion 37.

The imaging function portion 35, the connecting portion 36, and the connector forming portion 37 are defined by the single multilayer body 110. Thus, there is no need to mechanically connect the imaging function portion 35, the connecting portion 36, and the connector forming portion 37, for example, with solder. Hence, the stress in bending is dispersed, and this enhances the resistance to bending and warpage.

The imaging function portion 35 and the connector forming portion 37 include the flexible base material layers 11*a* to 11*c*, but the connecting portion 36 does not include the flexible base material layers 11*a* to 11*c*. For this reason, the imaging function portion 35 and the connector forming portion 37 are thick, but the connecting portion 36 is thin. Thus, the strength (rigidity) of the imaging function portion 35 and the connector forming portion 37 is increased, and this maintains the imaging function and ease of attachment of the connector. Further, flexibility of the connecting portion 36 is ensured, and bending and routing are facilitated.

The image sensor IC 22 is contained in the cavity 12. For this reason, it is possible to greatly reduce or prevent irradiation of the receiving surface of the image sensor IC 22 with external light other than light passing through the lens 23. This enhances imaging performance.

Preferably, the aperture area of the cavity 12 is close to the area of the principal surface of the image sensor IC 22. In this case, the image sensor IC 22 is reliably protected. Further, since light from the open surface of the cavity 12 is prevented from being captured by the light receiving element 221, the light shielding property is improved.

The cover member 26 is disposed on the open surface of the cavity 12. As described above, the cover member 26 is formed by a material having the light shielding property and shaped like a flat plate, and is shaped to cover the entire open surface of the cavity 12. By disposing such a cover member 26, unnecessary light from the outside is greatly reduced or prevented from entering the cavity 12 and being applied onto the light receiving surface of the image sensor IC 22.

As the cover member 26, a member having a strength higher than that of the flexible base material layers 11*a* to 11*f* is preferably used, and for example, a metallic member is used. This improves the shape retaining function of the cavity 12 and increases the strength of the imaging function portion 35.

The conductor patterns 13 and the via conductors 14 are provided in the imaging function portion 35 to realize a portion or the entirety of the circuit function of the peripheral circuit unit 41 (see FIG. 3). Since the portion of the multilayer body 110 that defines the imaging function portion 35 includes the conductor patterns 13 and the via conductors 14, the strength of the imaging function portion 35 is increased. The conductor patterns 13 and the via conductors 14 in the imaging function portion 35 may be simple lines.

The peripheral circuit unit 41 is provided as a portion of the multilayer body 110. Further, the peripheral circuit unit 41 is disposed with high density in a side surface portion of the cavity 12. Thus, since the peripheral circuit unit 41, the lens unit 25, and the image sensor IC 22 are hardly arranged in line in the thickness direction, the imaging function portion 35 is able to be thinned, and deformation of the cavity 12 is significantly reduced or prevented.

For example, the thickness of the connector forming portion 37 may be equal to the thickness of the connecting portion 36. However, when the connector forming portion 37 is made thick, similarly to the imaging function portion 35, the strength of the connector forming portion 37 is increased. Thus, it is possible to significantly reduce or prevent bending and warpage of the connector forming portion 37 when the connector element 27 is attached to a motherboard. Therefore, the connector element 27 is easily attached, and fracture of a boundary portion between the connector forming portion 37 and the connecting portion 36 due to attachment is prevented.

According to the above-described structure, it is possible to realize a low-profile camera module 10 in which the connecting portion 36 is easily deformed (for example, bent) in accordance with a setting condition while ensuring high rigidity of the imaging function portion 35 and the connector forming portion 37.

Second Preferred Embodiment

A manufacturing method for a camera module 20 according to a second preferred embodiment of the present invention will be described. FIGS. 6A, 6B, and 7A to 7C are sectional side views illustrating the manufacturing method for the camera module 20.

Figure 6A:
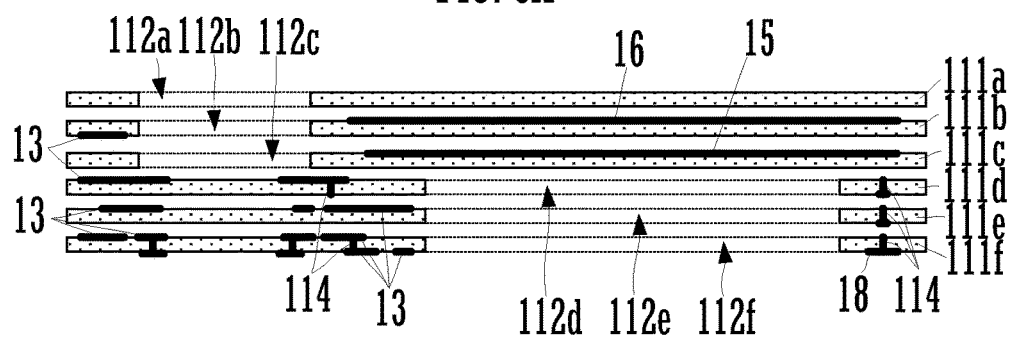
FIGS. 6A and 6B are sectional side views illustrating a manufacturing method for a camera module according to a second preferred embodiment of the present invention.

As illustrated in FIG. 6A, flexible sheets 111a to 111f including conductor patterns 13, through holes 112a to 112f, and so on are stacked. Then, the stacked flexible sheets 111a to 111f are subjected to thermocompression bonding. A multilayer body 110 including flexible base material layers 11a to 11f is thus formed. A cavity 12 is formed in a first principal surface of the multilayer body 110.

Figure 6B:
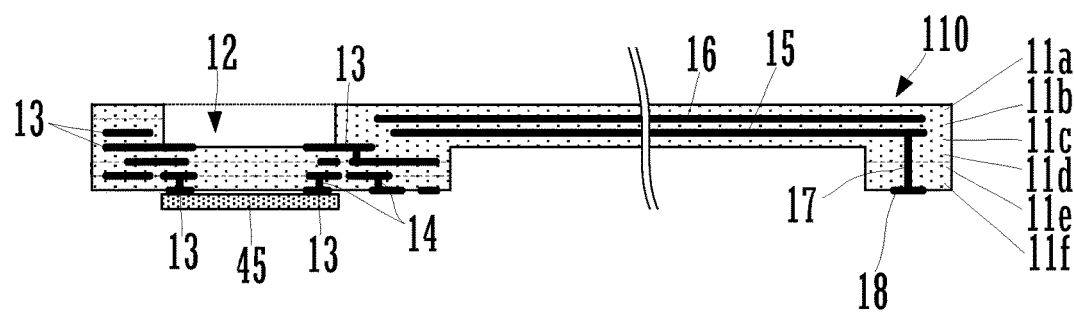

Next, as illustrated in FIG. 6B, a substrate 45 is disposed on a second principal surface (principal surface opposite from the first principal surface) of the multilayer body 110 so as to overlap with the cavity 12 in plan view. For example, the substrate 45 is a glass epoxy substrate. However, the substrate 45 may be formed of other materials as long as the elastic modulus of the substrate 45 is higher than the elastic modulus of the flexible base material layers 11a to 11f. For example, a ceramic substrate or a metal plate may be used as the substrate 45. The elastic modulus of the flexible base material layers 11a to 11f using a liquid crystal polymer is about 7 GPa, and the elastic modulus of the glass epoxy substrate is about 20 GPa, for example. The substrate 45 corresponds to the second member in the present invention.

Then, the substrate 45 is joined to the conductor pattern 13 provided on the second principal surface by ultrasonic welding, for example. Alternatively, the conductor pattern 13 and the substrate 45 may be joined, for example, with solder or an anisotropic conductive adhesive.

Figure 7A:
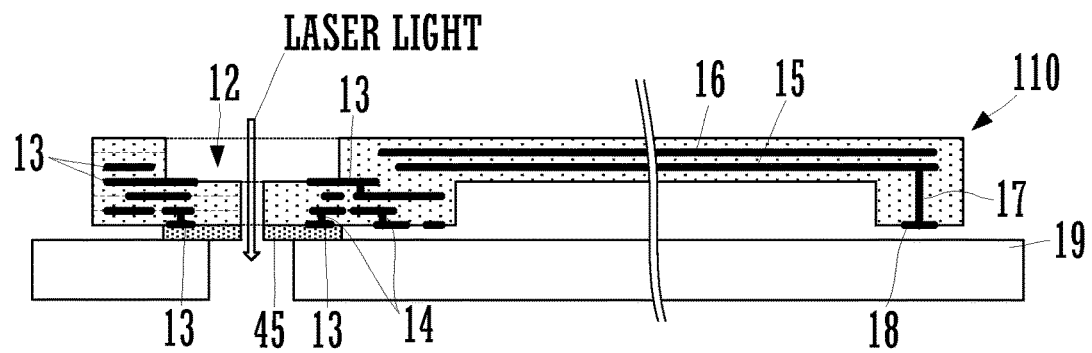
FIGS. 7A to 7C are sectional side views illustrating the manufacturing method for the camera module of the second preferred embodiment of the present invention.
Figure 7B:
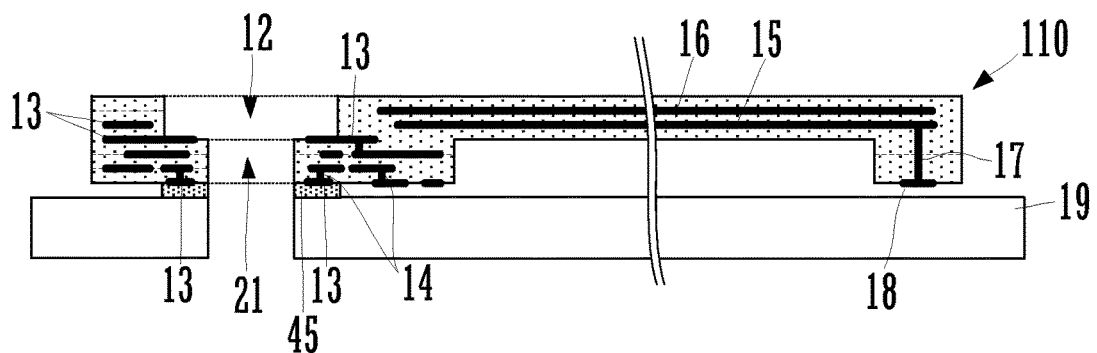

Next, as illustrated in FIG. 7A, the substrate 45 is set in contact with a flat working surface of a worktable 19. Then, as illustrated in FIGS. 7A and 7B, laser light is applied onto a bottom surface of the cavity 12 from the side of the first principal surface of the multilayer body 110 to form a through hole 21 in the multilayer body 110 and the substrate 45. Similarly to the first preferred embodiment, the through hole 21 may be formed by blanking or shearing and force cutting. The use of laser light is preferable because the substrate 45 is less likely to be fractured than when blanking or shearing and force cutting is performed.

Figure 7C:
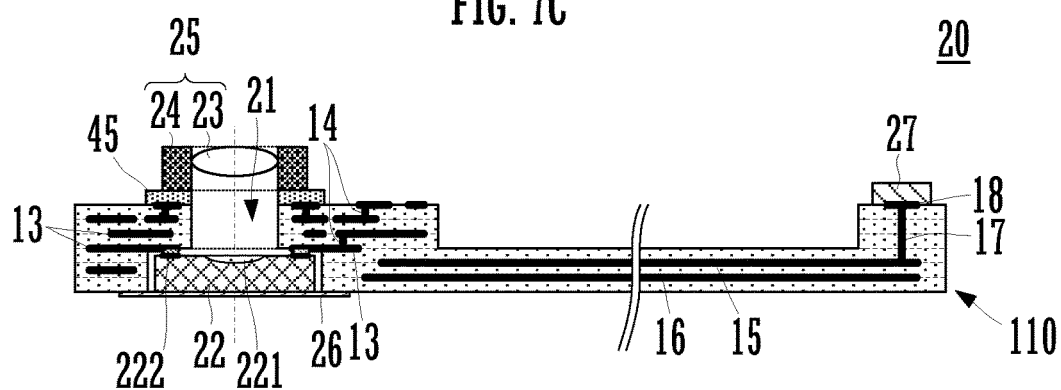

Next, as illustrated in FIG. 7C, a lens unit 25 is mounted on the substrate 45. Further, an image sensor IC 22 is mounted within the cavity 12, and an open surface of the cavity 12 is covered with a cover member 26.

Finally, a camera module 20 illustrated in FIG. 7C is completed by cutting a multi-sheet in which a plurality of structures of the camera module 20 are arranged.

In other respects, the steps are similar to those in the first preferred embodiment.

In the second preferred embodiment, the substrate 45 is provided between the multilayer body 110 and the lens unit 25. This increases the strength of an imaging function portion 35. Further, when a circuit pattern is formed on the substrate 45, the substrate 45 is able to be used as an interposer. Even in the structure in which the substrate 45 is added, a wall surface of the through hole 21 is not stepped, and advantages similar to those of the first preferred embodiment are obtained.

Third Preferred Embodiment

A manufacturing method for a camera module 30 according to a third preferred embodiment of the present invention will be described. FIGS. 8A to 8D are sectional side views illustrating the manufacturing method for the camera module 30.

As illustrated in FIG. 8A, flexible sheets 111a to 111f are stacked. Then, a substrate 45 is disposed on the flexible sheet 111d so as to be located within through holes 112a to 112c in plan view. At this time, a conductor pattern 46a provided in the substrate 45 is set in contact with conductive paste 114a filled in holes for via conductors.

Next, the stacked flexible sheets 111a to 111f are subjected to thermocompression bonding. A multilayer body 110 including flexible base material layers 11a to 11f is formed thereby. A cavity 12 is formed in a first principal surface of the multilayer body 110, and the substrate 45 is disposed on a bottom surface of the cavity 12.

Figure 9:
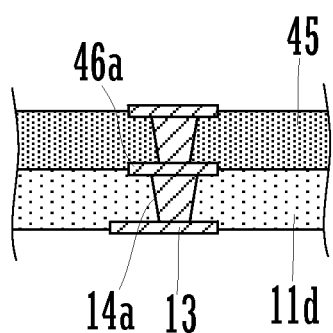
FIG. 9 is a sectional side view illustrating a structure in which a via conductor and a conductor pattern are joined.
Figure 10A:
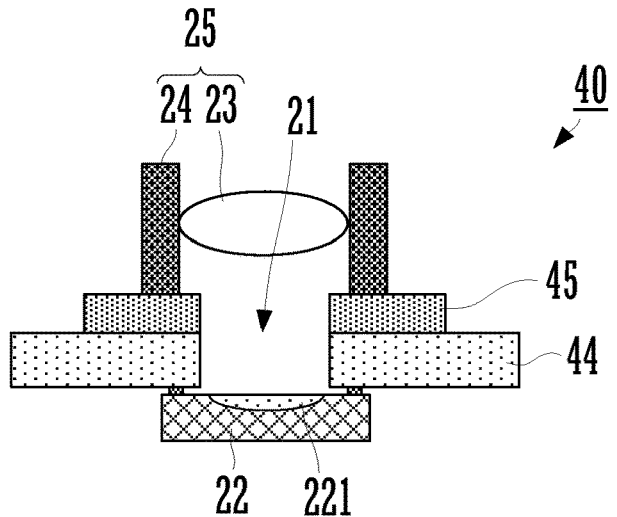
FIG. 10A is a sectional side view of a camera module of the related art.
Figure 10B:
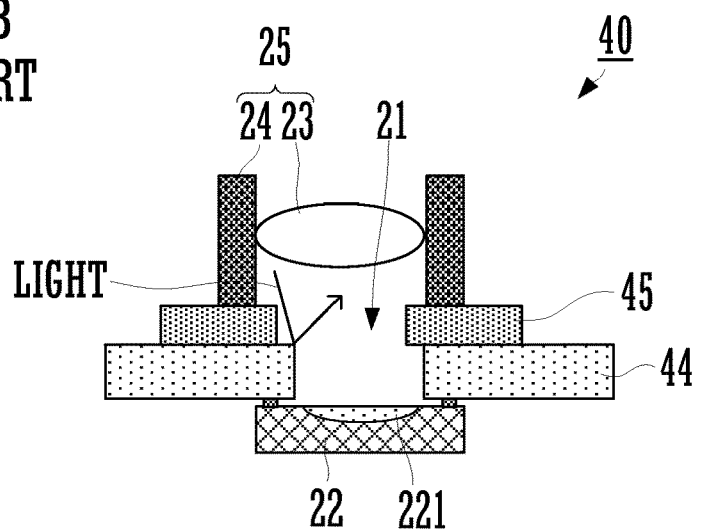
FIG. 10B is a sectional side view of the camera module of the related art when the positions of through holes are misaligned.
Figure 10C:
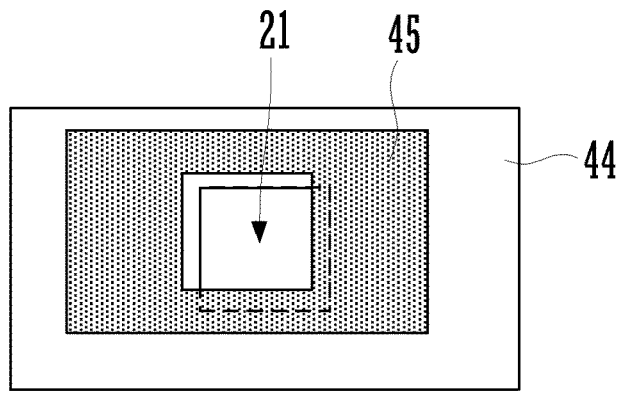
FIG. 10C is a plan view of substrates when the positions of the through holes are misaligned.

At the time of thermocompression bonding, the conductive paste 114a is metalized to form via conductors 14a joined to the conductor pattern 46a. That is, as illustrated in FIG. 9, a structure in which the via conductors 14a and the conductor pattern 46a are joined is formed by thermocompression bonding. Thus, the substrate 45 is fixed to the bottom surface of the cavity 12. According to this step, a joining material for fixing the substrate 45 is unnecessary. Further, since the substrate 45 is fixed to the bottom surface of the cavity 12 simultaneously with thermocompression bonding of the flexible sheets 111a to 111f, the number of steps is reduced. Alternatively, the substrate 45 may be fixed to the bottom surface of the cavity 12, for example, with solder or an anisotropic conductive adhesive.

The conductive paste 114a and the via conductors 14a correspond to the interlayer connection conductor in the present invention. The conductor pattern 46a corresponds to the conductor layer in the present invention.

Next, as illustrated in FIGS. 8B and 8C, a through hole 21 is formed in the multilayer body 110 and the substrate 45 by applying laser light onto the substrate 45 from the side of the first principal surface of the multilayer body 110.

Next, an image sensor IC 22 including a light receiving element 221 and an external connection land 222 is mounted within the cavity 12. At this time, the external connection land 222 is connected to a conductor pattern 46b provided on the substrate 45. Then, an open surface of the cavity 12 is covered with a cover member 26. Further, a lens unit 25 is mounted on the first principal surface of the multilayer body 110.

Finally, a camera module 30 illustrated in FIG. 8D is completed by cutting a multi-sheet on which a plurality of structures of the camera module 30 are arranged. In other respects, the steps are similar to those in the first preferred embodiment.

In the third preferred embodiment, the substrate 45 is provided between the multilayer body 110 and the image sensor IC 22. This increases the strength of an imaging function portion 35, similarly to the second preferred embodiment. Even in the structure in which the substrate 45 is added in the cavity 12, a wall surface of the through hole 21 is not stepped, and advantages similar to those of the first preferred embodiment are obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A manufacturing method for a camera module including a multilayer body in which an image sensor IC and a lens are arranged with an optical path provided in the multilayer body being disposed therebetween, the manufacturing method comprising:
 a first step of forming the multilayer body which includes a cavity by stacking and combining a plurality of first members;
 a second step of forming a through hole in the plurality of first members that constitute at least a portion of the multilayer body from the cavity to form the optical path defined by the through hole; and
 a third step of mounting the image sensor IC and the lens with the through hole being disposed therebetween; wherein
 the cavity is opened inward from a first surface of the multilayer body in a stacking direction;
 the through hole extends from a bottom surface of the cavity to a second surface of the multilayer body in the stacking direction; and
 in the second step, the second surface of the multilayer body is set in contact with a flat or substantially flat working surface, and the through hole is formed from a side of the first surface of the multilayer body.

2. The manufacturing method for the camera module according to claim 1, wherein the through hole is formed by laser machining in the second step.

3. The manufacturing method for the camera module according to claim 1, wherein each of the first members is formed of thermoplastic resin.

4. The manufacturing method for the camera module according to claim 1, wherein each of the first members is formed of a liquid crystal polymer.

5. The manufacturing method for the camera module according to claim 1, wherein each of the first members is a flexible sheet including a metal film on at least one surface thereof.

6. The manufacturing method for the camera module according to claim 1, wherein the first step includes thermocompression bonding the first members.

7. The manufacturing method for the camera module according to claim 6, wherein, during the first step, conductive paste is filled in holes to form via holes.

8. A manufacturing method for a camera module including a multilayer body in which an image sensor IC and a lens are arranged with an optical path provided in the multilayer body being disposed therebetween, the manufacturing method comprising:
 a first step of forming the multilayer body which includes a cavity by stacking and combining first and second members;
 a second step of forming a through hole in the stacked and combined first and second members from the cavity to form the optical path defined by the through hole; and
 a third step of mounting the image sensor IC and the lens with the through hole being disposed therebetween; wherein
 the cavity is opened inward from a first surface of the multilayer body in a stacking direction; and
 the second member is disposed on a bottom surface of the cavity.

9. The manufacturing method for the camera module according to claim 8, wherein
 the first member includes a plurality of first members;
 the manufacturing method further comprises a fourth step of stacking and combining the plurality of first members; wherein
 the first step is performed after the fourth step.

10. The manufacturing method for the camera module according to claim 8, wherein
 the first member includes a plurality of first members;
 the manufacturing method further comprises a fourth step of stacking and combining the plurality of first members; wherein
 the first step and the fourth step are performed simultaneously.

11. The manufacturing method for the camera module according to claim 8, wherein, in the second step, a second surface of the multilayer body in the stacking direction is set in contact with a flat or substantially flat working surface, and the through hole is formed from a side of the first surface of the multilayer body.

12. The manufacturing method for the camera module according to claim 8, wherein the second member has a flat plate shape and an elastic modulus higher than an elastic modulus of the first member.

13. The manufacturing method for the camera module according to claim 8, wherein the through hole is formed by laser machining in the second step.

14. The manufacturing method for the camera module according to claim 8, wherein, in the first step, heat-pressing is performed while an interlayer connection conductor provided in the first member and a conductor layer provided in the second member are in contact with each other.

15. The manufacturing method for the camera module according to claim 8, wherein each of the first members is formed of thermoplastic resin.

16. The manufacturing method for the camera module according to claim 8, wherein each of the first members is formed of a liquid crystal polymer.

17. The manufacturing method for the camera module according to claim 8, wherein each of the first members is a flexible sheet including a metal film on at least one surface thereof.

18. The manufacturing method for the camera module according to claim 8, wherein the first step includes thermocompression bonding the first members.

* * * * *